(12) United States Patent
Sapochak et al.

(10) Patent No.: US 7,893,430 B2
(45) Date of Patent: Feb. 22, 2011

(54) OLED DEVICES

(75) Inventors: Linda Susan Sapochak, Arlington, VA (US); Paul Edward Burrows, Kennewick, WA (US); Asanga Bimalchandra, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 169 days.

(21) Appl. No.: 12/380,315

(22) Filed: Feb. 26, 2009

(65) Prior Publication Data

US 2010/0213443 A1 Aug. 26, 2010

(51) Int. Cl.
H01L 21/00 (2006.01)
(52) U.S. Cl. .............................. 257/40; 257/94; 257/99; 257/103; 257/E33.001; 257/E51.044
(58) Field of Classification Search ................... 257/40, 257/94–98, 103, E33.001, 51.018, 44
See application file for complete search history.

(56) References Cited

U.S. PATENT DOCUMENTS

| | | | |
|---|---|---|---|
| 6,573,651 B2 * | 6/2003 | Adachi et al. ............... | 313/504 |
| 6,900,588 B2 * | 5/2005 | Adachi et al. ............... | 313/504 |
| 7,345,300 B2 * | 3/2008 | Qin et al. ..................... | 257/40 |
| 7,553,560 B2 * | 6/2009 | Lamansky et al. .......... | 428/690 |
| 7,772,761 B2 * | 8/2010 | Choulis et al. .............. | 313/504 |
| 2002/0113545 A1 * | 8/2002 | Adachi et al. ............... | 313/504 |
| 2007/0075631 A1 * | 4/2007 | Tung et al. ................... | 313/504 |
| 2007/0088167 A1 * | 4/2007 | Lin et al. ..................... | 548/103 |
| 2008/0203406 A1 * | 8/2008 | He et al. ....................... | 257/94 |
| 2010/0090241 A1 * | 4/2010 | D'Andrade et al. .......... | 257/98 |

* cited by examiner

Primary Examiner—Michael S Lebentritt
(74) Attorney, Agent, or Firm—Douglas E. McKinley, Jr.

(57) ABSTRACT

An OLED device having an emission layer formed of an ambipolar phosphine oxide host material and a dopant, a hole transport layer in electrical communication with an anode, an electron transport layer in communication with a cathode, wherein the HOMO energy of the hole transport layer is substantially the same as the HOMO energy of the ambipolar host in the emission layer, and the LUMO energy of the electron transport layer is substantially the same as the LUMO energy of the ambipolar host in the emission layer.

13 Claims, 8 Drawing Sheets

OLED DEVICES

The invention was made with Government support under Contract DE-AC0676RLO 1830, awarded by the U.S. Department of Energy. The Government has certain rights in the invention.

Cross Reference to related applications (if any). (Related applications may be listed on an application data sheet, either instead of or together with being listed in the specification.)

TECHNICAL FIELD

This invention relates to organic light emitting devices (OLEDs). More specifically, this invention relates to improved OLEDs that are more efficient at converting electrical energy into light than prior art devices.

BACKGROUND OF THE INVENTION

Organic light-emitting devices (OLEDs) are electroluminescent devices which contain one or more organic compounds arranged as thin films between two electrodes, one of which is substantially transparent. They are typically deposited in rows and columns onto a flat carrier by evaporation in a vacuum, casting from a solvent or a variety of "printing" processes. The resulting matrix of pixels can display an image by emitting light of different colors or can be arranged to uniformly emit colored or white light for use as an illumination device.

OLEDs can be used in television screens, computer displays, portable system screens, advertising, information and as indicator lamps. OLEDs can also be used in light sources for general space illumination, and large-area light-emitting elements.

A significant benefit of OLEDs relates to their efficiency in turning electrical power into light. For example, green OLEDs have been demonstrated at an efficiency of 130 lumens per watt. Furthermore, OLED displays are preferred over traditional liquid crystal displays (LCDs) because OLEDs do not require a backlight to function. Thus they draw less power and, therefore, when powered from a battery, can operate longer on the same charge. Because there is no need for a backlight, polarizers or color filter array, an OLED display can also be much thinner than a LCD panel and may also be cheaper to manufacture.

Bernanose and co-workers first produced electroluminescence in organic materials in the early 1950s by applying a high-voltage alternating current (AC) field to crystalline thin films of acridine orange and quinacrine. In 1960, researchers at Dow Chemical developed AC-driven electroluminescent cells using doped anthracene. Such materials are generally known as "small molecules."

The first low voltage thin film OLED was invented at Eastman Kodak by Dr. Ching Tang and Steven Van Slyke in the 1980s. This device used a two-layer structure with separate hole transporting and electron transporting layers such that recombination and light emission occurred at the interface between the two organic layers. This resulted in a reduction in operating voltage and improvements in efficiency, and started the current era of OLED research and device production. Later, this concept was adapted for use with polymers as reported for a green-light-emitting polymer in the Burroughs et al. 1990 paper in the journal Nature. Both small molecule and polymer OLEDs have now been widely studied and demonstrated in commercial prototypes.

More recently, the use of phosphorescent instead of fluorescent light emitting materials enabled much higher OLED efficiency (e.g. "Highly efficient phosphorescent emission from organic electroluminescent devices." M. A. Baldo, D. F. O'Brien, Y. You, A. Shoustikov, S. Sibley, M. E. Thompson and S. R. Forrest *Nature* 395, 151-154 (10 Sep. 1998). Typically, organic phosphors are doped into a conductive host matrix and emission results from energy transfer from the host to the triplet state of the phosphor. Development of efficient blue OLEDs based on this technology, however, has been particularly challenging because the host material must exhibit triplet level emission at $\leq 470$ nm to achieve efficient energy transfer and, furthermore, this high triplet exciton energy must be achieved without sacrificing the good charge transporting properties of the host layer. Current host materials do not meet these requirements, because there is a tradeoff between increasing the bandgap of the material to increase emission energies and decreasing the $\pi$-aromatic system, which may adversely affect charge transport properties. Deeper blue phosphors have only been demonstrated by using substantially insulating, wide bandgap host materials, in which charge transport occurs via hopping between adjacent dopant molecules. This leads to a high voltage, particularly at the high current densities required for bright lighting applications, and therefore less efficient devices.

An alternative route to design host molecules for efficient blue phosphorescence at low voltages is to use a point of saturation, such as a phosphoryl group, to link small, high triplet energy molecular fragments into a larger molecule without extending the conjugation length of the fragments and thereby lowering the triplet exciton energy of the larger molecule. This is important because very small molecules tend to be volatile and have poor film-forming properties so it is desirable to reproduce their photophysical properties in a larger, stable molecule. For example, aromatic diphosphine oxides are stable compounds which exhibit electroluminescence in the ultraviolet spectral region (335 nm for one example already published as P. E. Burrows, A. Padmaperuma, and L. S. Sapochak, P. Djurovich and M. E. Thompson "Ultraviolet Electroluminescence and Blue-Green Phosphorescence using an Organic Diphosphine Oxide Charge Transporting Layer." Appl. Phys. Lett. 88, 183503 (2006)). Thus, it is possible to achieve a high triplet exciton energy without sacrificing the aromatic backbone of the molecule, which makes these materials excellent hosts for high efficiency blue phosphors, as well as longer wavelength OLEDs. Furthermore, the inductive influence of the phosphoryl group gives rise to good electron transport at low voltages. Unfortunately, however, molecules based on phosphoryl compounds have not shown good hole transporting properties. This leads to unequal densities of electrons and holes in the organic layer and, consequently, sub-optimal efficiency. Indeed, it has been demonstrated in the literature that most of the holes that penetrate into the recombination zone are actually transported via hopping conduction on the phosphorescent dopant rather than the host itself.

The low injection and transport efficiency of holes in organic phosphine oxide compounds is due to the stabilization of the highest occupied molecular orbital (HOMO) by the phosphoryl groups, leading to a very low HOMO energy and a concomitantly high injection barrier for holes from the hole transporting layer into the phosphine oxide host layer. It is therefore necessary to seek further improvements to the phosphine oxide materials which permit the HOMO of the host layer to be matched to that of the hole transport layer while not raising the LUMO such that a barrier is introduced for electron injection.

The need for more efficient use of electricity has spurred large and ongoing investments into research and development aimed at improving OLEDs. Those having ordinary skill in the art are continually seeking to improve the efficiency of OLED devices, and those having skill in the art recognize that any inventions or discoveries that increase the efficiency of OLEDs represent an advance in the state of the art. It is known to those skilled in the art that phosphoryl-containing organic molecules can be used to make thin films with good electron transporting properties and high triplet exciton energies but such materials invariably show poor hole transport properties and, indeed, they have even been proposed as hole blocking layers. To achieve the maximum possible efficiency in an OLED, however, it is important to ensure an equal density of holes and electrons in the recombination layer which requires good electron transport and hole transport properties. The present invention provides this improvement, and consequently improved efficiency in OLED devices, and thus represents an advance in the state of the art.

SUMMARY OF THE INVENTION

Figure 1:
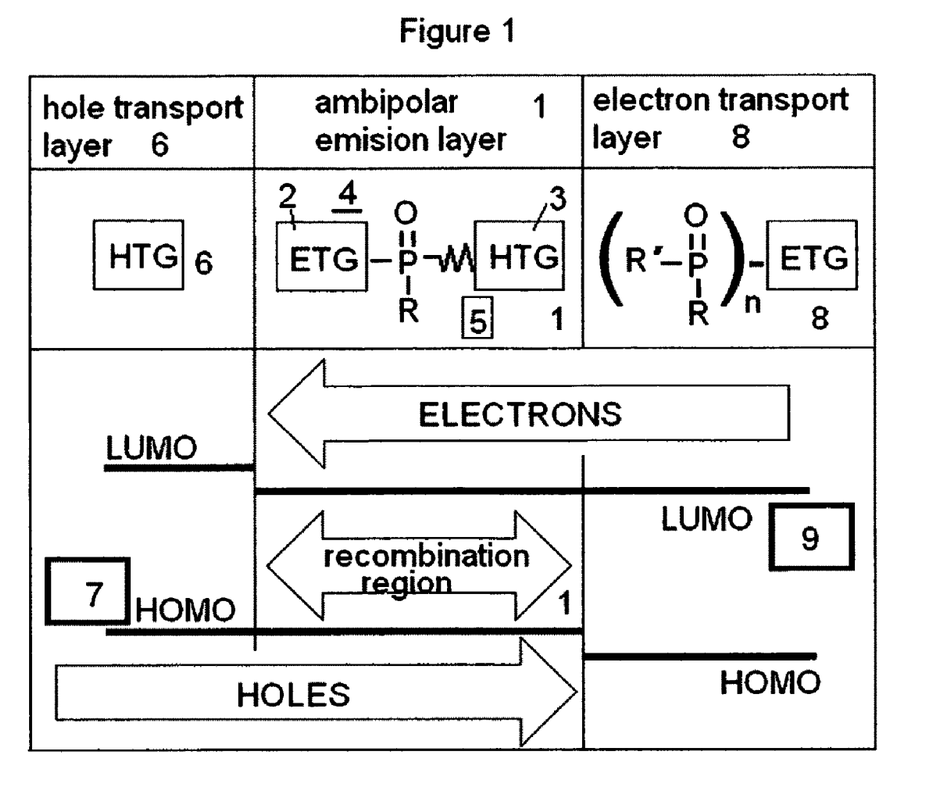
FIG. 1 is a schematic diagram of the present invention which shows the molecular design as schematic block figures in the first row and the resulting alignment of the lowest occupied and highest unoccupied molecular orbitals (LUMO and HOMO, respectively).

The object of this invention is to improve the efficiency of OLEDs by using a system of materials which includes a novel class of organic phosphoryl compounds which transport both electrons and holes (known as "ambipolar compounds") to improve the balance of electrons and holes in the recombination region. The system of hole transporting, electron transporting and ambipolar host materials is designed such that there are no large barriers to injection of electrons and holes into the host layer from the electron transporting and hole transporting layers, respectively. To accomplish this, the energy of the LUMO and HOMO in the ambipolar, phosphoryl-containing, host layer is tuned to be close to those of the hole transporting and electron transporting layers, which comprise molecules containing hole transporting groups (HTG) and electron transporting groups (ETG), respectively. The ambipolar host material is created by substituting phosphoryl groups onto the HTG and/or ETG, creating a larger molecule with a HOMO and LUMO very close in energy to that of the unsubstituted molecule. This works because the phosphoryl groups act as points of electronic saturation, preventing conjugation of electrons throughout the larger molecule and isolating the electronic functionality of the ETG and HTG, respectively. By using phosphoryl substitution, therefore, in a molecule containing both ETG and HTG groups, it is possible to create an ambipolar host molecule that works as part of a matched system including the HTG, host and ETG molecules, specifically where the LUMO of the host is closely matched to the LUMO of the ETG and the HOMO of the host is closely matched to the HOMO of the HTG. By this means, efficient injection of both electrons and holes into the host material is achieved, thereby improving the charge balance and overall efficiency of the OLED. This design concept is illustrated in FIG. 1.

As used herein, the term "ambipolar" means that the layer does not substantially block either electrons or holes when used as one layer in a multi-layer OLED. As a result, both electrons and holes can penetrate deep into the host layer, resulting in a broad recombination zone and a high quantum efficiency at low operating voltage.

BRIEF DESCRIPTION OF THE DRAWINGS

The following detailed description of the embodiments of the invention will be more readily understood when taken in conjunction with the following drawings, wherein.

DETAILED DESCRIPTION OF THE PREFERRED EMBODIMENTS

For the purposes of promoting an understanding of the principles of the invention, reference will now be made to the embodiments illustrated in the drawings and specific language will be used to describe the same. It will nevertheless be understood that no limitations of the inventive scope are thereby intended, as the scope of this invention should be evaluated with reference to the claims appended hereto. Alterations and further modifications in the illustrated devices, and such further applications of the principles of the invention as illustrated herein are contemplated as would normally occur to one skilled in the art to which the invention relates.

The concept of a system of layers pertaining to the invention in a three layer device is shown in FIG. 1 which shows molecular designs as schematic block figures in the first row and the resulting alignment of the lowest occupied and highest unoccupied molecular orbitals (LUMO and HOMO, respectively).

As shown in the schematic of FIG. 1, the present invention is an OLED device formed of an emission layer 1. The emission layer 1 has a first side 2 and a second side 3 and is formed of an ambipolar phosphine oxide host material 4 and a dopant 5. The first side 2 of the emission layer 1 is in electrical communication with a hole transport layer 6 formed of a hole transport group (labeled "HTG"), and the hole transport layer 6 is in electrical communication with an anode 7. The second side 3 of the emission layer 1 is in electrical communication with an electron transport layer 8 formed of an electron transport group, (labeled "ETG"), and the electron transport layer 8 is in communication with a cathode 9.

As shown in FIG. 1, the materials of the present invention are selected such that the HOMO energy of the hole transport layer 6 is substantially the same as the HOMO energy of the ambipolar host in the emission layer 1, and the LUMO energy of the electron transport layer 8 is substantially the same as the LUMO energy of the ambipolar host in the emission layer 1.

Those skilled in the art will appreciate that more layers may be added to improve electron and hole injection and/or confinement from the electrodes into the device but this will not change the design of the ambipolar host layer and the layers immediately surrounding it.

Figure 2:
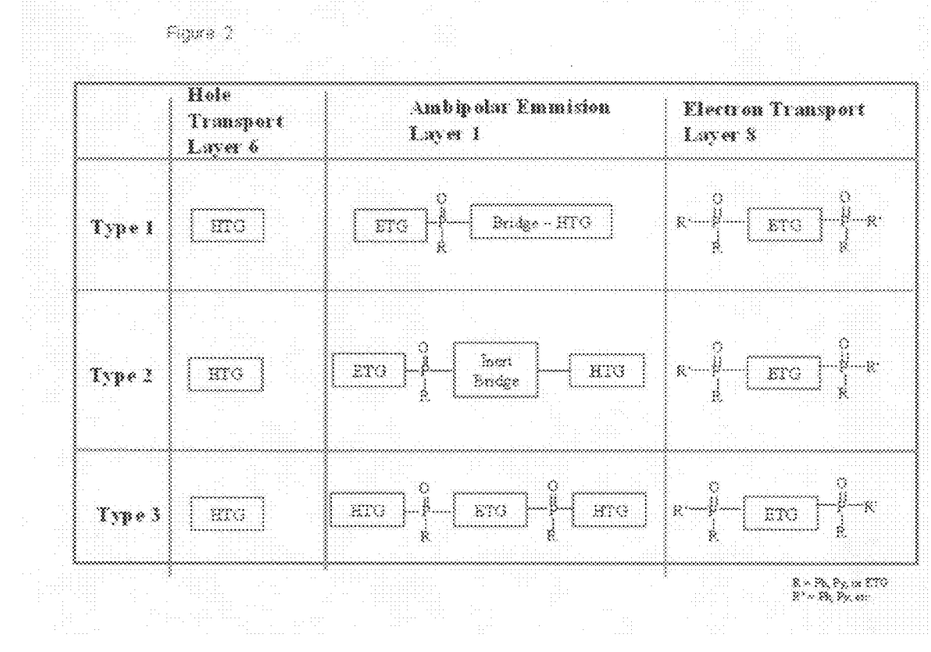
FIG. 2 is a schematic diagram of the present invention which shows the molecular design of the Hole Transport Layer, Ambipolar Emission Layer, and the Electron Transport Layer

Three separate embodiments to accomplish this design are shown in FIG. 2. The anode (not shown) is electrically connected to Hole Transport Layer 6, which, as previously mentioned, is composed of a hole transporting material with hole transporting groups "HTG" which permit facile injection of holes from the anode or a hole injection layer formed on an anode and facile transport of holes through the layer. As used herein, therefore, the term "electrically connected" does not preclude the use of further intermediate layers to promote the transport of charge from the anode into Hole Transport Layer 6. Hole Transport Layer 6 is electrically connected to Ambipolar Emission Layer 1, which is comprised of ambipolar molecules formed by chemically linking HTG moieties with phosphoryl-containing electron transporting molecules (defined as molecules "ETG" which permit facile injection of electrons from the cathode and transport of electrons through the layer) via a molecular bridge. Because of the point of saturation introduced by the phosphoryl group, the HOMO of Ambipolar Emission Layer 1 is substantially equal in energy to the HOMO of Hole Transport Layer 6, preferably within 0.2 eV as measured by ultraviolet photoelectron spectroscopy (UPS) and holes can therefore easily be injected from Hole Transport Layer 6 to Ambipolar Emission Layer 1. The ambipolar nature of Ambipolar Emission Layer 1 furthermore, results in holes being transported deep into Ambipolar Emission Layer 1. Ambipolar Emission Layer 1 is electrically connected to electron transport layer 8, which is in turn electrically connected to a cathode (not shown). Electron transport layer 8 is comprised of phosphoryl-containing, electron transporting molecules ETG, which are the same as the ETG groups in Ambipolar Emission Layer 1. The LUMO of electron transport layer 8 is therefore preferably substantially equal in energy to the LUMO of Ambipolar Emission Layer 1 (within 0.2 eV as measured by UPS) and electrons can therefore easily be injected from electron transport layer 8 to Ambipolar Emission Layer 1. Furthermore, the previously demonstrated properties of the phosphoryl-containing ETG permits facile injection of electrons from the cathode into electron transport layer 8. The overall result is a high concentration of electrons and holes in Ambipolar Emission Layer 1 (the emissive layer) at low operating voltage, and a concomitantly high efficiency light emitting device. This type of energy level alignment with chemically stable, electron transporting groups ETG has been demonstrated using the phosphoryl-substituted materials described in the literature; see L. S. Sapochak, A. B. Padmaperuma, X. Cai, J. Male, and P. E. Burrows "Inductive effects of diphenylphosphoryl moieties on carbazole host materials: Design rules for blue electrophosphorescent organic light-emitting devices." J. Phys. Chem. C, 112 (21), 7989-7996 (2008); X. Cai, A. B. Padmaperuma, L. S. Sapochak, P. A. Vecchi and P. E. Burrows "Electron and Hole Transport in a Wide Bandgap Organic Phosphine Oxide for Blue Electrophosphorescence." Appl. Phys. Lett. 92, 083308 (2008); L. S. Sapochak, A. B. Padmaperuma, P. A. Vecchi, X. Cai, and P. E. Burrows "Designing Organic Phosphine Oxide Host Materials Using Heteroaromatic Building Blocks: Inductive Effects on Electroluminescence Organic Light-Emitting Devices and Materials XI-Proceedings SPIE 6655, 65506-1 (2007); L. S. Sapochak, A. B. Padmaperuma, P. A. Vecchi, H. Qiao and P. E. Burrows "Design strategies for achieving high triplet energy electron transporting host materials for blue electrophosphorescence." in *Organic Light-Emitting Devices and Materials X*—Proc. SPIE 6333, 57 (2006); P. A. Vecchi, A. B. Padmaperuma, H. Qiao, L. S. Sapochak and P. E. Burrows "A Dibenzofuran-Based Host Material for Blue Electrophosphorescence." Org. Lett. 8, 4211 (2006); A. B. Padmaperuma, L. S. Sapochak and P. E. Burrows, "A New Charge Transporting Host Material for Short Wavelength Organic Electrophosphorescence: 2,7-Bis(diphenylphosphine oxide)-9,9-dimethylfluorene" Chem. Mater. 18, 2389 (2006); P. E. Burrows, A. Padmaperuma, and L. S. Sapochak, P. Djurovich and M. E. Thompson "Ultraviolet Electroluminescence and Blue-Green Phosphorescence using an Organic Diphosphine Oxide Charge Transporting Layer." Appl. Phys. Lett. 88, 183503 (2006).

It is preferred that the HOMO energy of the hole transporting group with respect to vacuum is between −4 eV and −7 eV and the LUMO energy of the electron transporting group with respect to vacuum is between −1 eV and −4 eV. In all of the following embodiments of the invention, the ETG is comprised of one or more phosphoryl groups bonded to a group selected from the set of molecules illustrated in FIG. 3.

Figure 4:
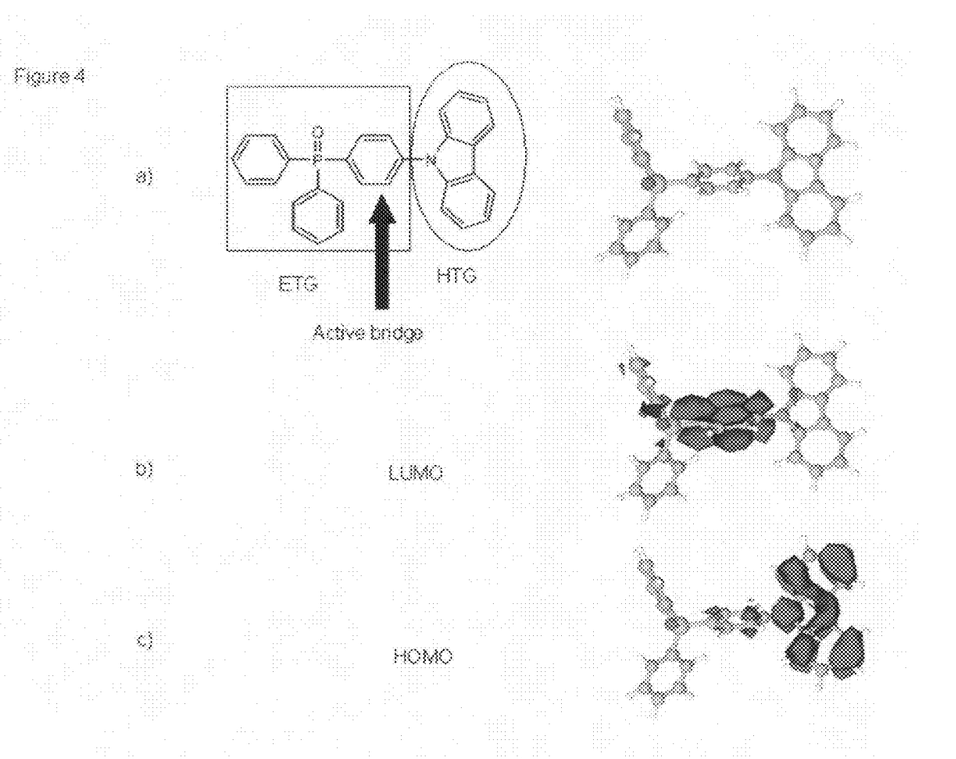
FIG. 4 (*a*) shows the chemical bond structure of an ambipolar, phosphoryl-containing molecule with an active (phenyl) bridge (left) and a geometry-optimized structure of the same molecule (right). (*b*) the spatial extent of the lowest unoccupied molecular orbital and (*c*) the spatial extent of the highest occupied molecular orbital.

FIG. 2 shows several possible configurations of the OLED device of the present invention, type 1, type 2, and type 3. As shown in FIG. 2, type 1 is a configuration where the ambipolar phosphine oxide host material has a phosphine oxide bonded to at least one electron transporting group, the phosphine oxide further bonded to an active bridge, the active bridge further bonded to a hole transporting group. In this configuration, the active bridge may be conjugated with the hole transporting group and the active bridge may be reversibly oxidized and reversibly reduced. As used in this example, the term "active bridge" means that the LUMO or HOMO may partially extend onto the bridge. A particular example of molecules conforming to this embodiment is shown in FIG. 4. FIG. 4a shows the chemical bond structure of the ambipolar host molecule (left) and the geometry-optimized structure (right, calculated using the Spartan '04 software package, Version 1.0.3 from Wavefunction, Inc. at the B3LYP/6-31G*level). In this embodiment, the ETG is triphenyl phosphine oxide, with one of the phenyl groups serving as the active bridge to link the ETG to an HTG, which consists of N-carbazole. FIGS. 4b and 4c show the spatial extent of the HOMO and LUMO, respectively. The LUMO is mostly localized on the phenyl active bridge while the HOMO is mostly localized on the carbazole moiety. In this case, the hole transporting layer would comprise a carbazole derivative such that its HOMO is matched with the ambipolar host and the electron transporting layer would comprise a triphenylphosphine oxide derivative such that its LUMO is matched with the LUMO of the ambipolar host.

Figure 5:
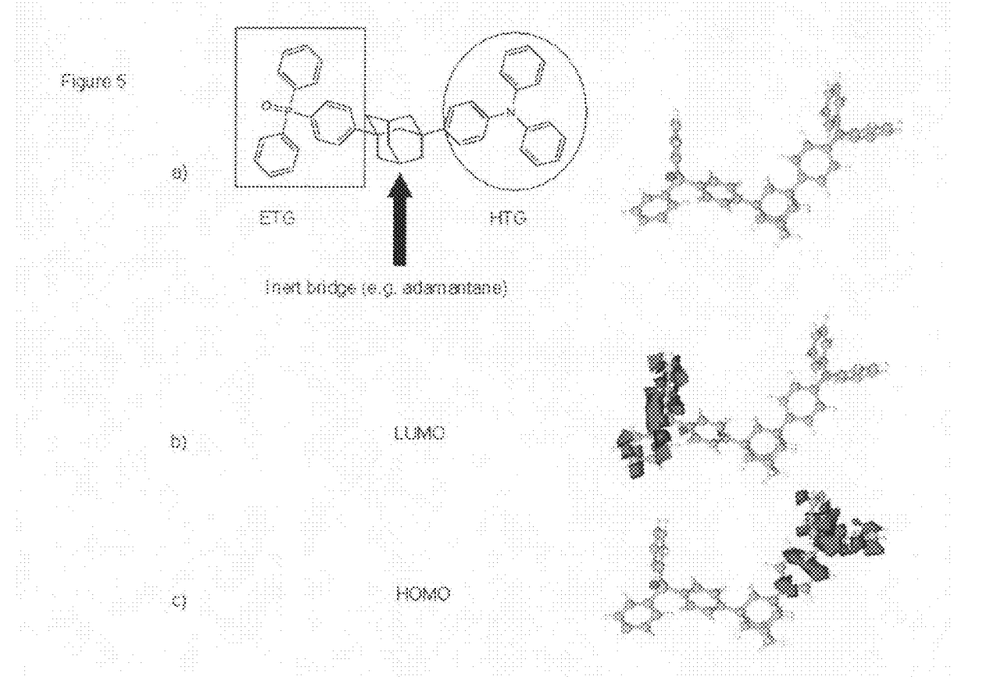
FIG. 5 (*a*) shows the chemical bond structure of an ambipolar, phosphoryl-containing molecule with an inert (adamantane) bridge (left) and a geometry-optimized structure of the same molecule (right). (*b*) the spatial extent of the lowest unoccupied molecular orbital and (*c*) the spatial extent of the highest occupied molecular orbital.

As is further shown in FIG. 2, type 2 is a configuration where the ambipolar phosphine oxide host material has a phosphine oxide bonded to at least one electron transporting group, the phosphine oxide is further bonded to an inert bridge, and the inert bridge is further bonded to a hole transporting group. In this configuration, the inert bridge may not be conjugated with the hole transporting group and the inert bridge may not be reversibly oxidized and reversibly reduced. In this manner, the phosphoryl-containing ETG is separated from the HTG via an inert bridge, i.e. a bridge that does not contain significant density of either the HOMO or the LUMO. Suitable inert bridges are saturated hydrocarbons (e.g. adamantane, cyclohexane, methylene). FIG. 5 shows (a) the chemical bond structure, the geometry-optimized structure and the spatial extent of (b) the HOMO and (c) the LUMO for this embodiment. In this embodiment, the orbital densities of the HOMO and LUMO are completely separated on the HTG and ETG, respectively.

Figure 6:
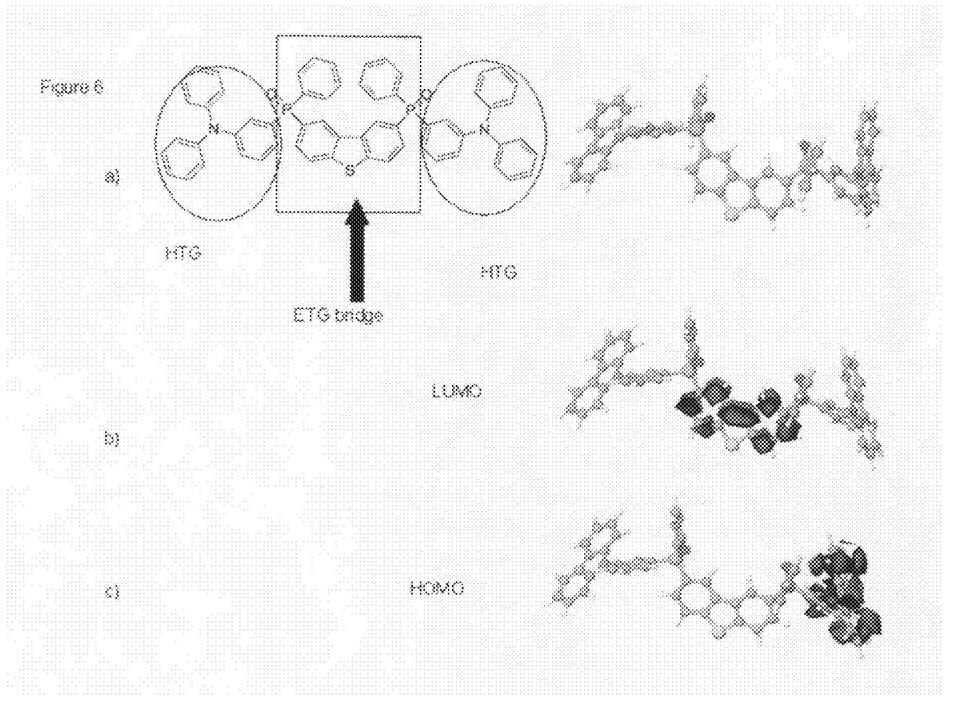
FIG. 6 (*a*) the chemical bond structure of an ambipolar, phosphoryl-containing molecule with an electron transporting (diphosphoryl dibenzothiophene) bridge (left) and a geometry-optimized structure of the same molecule (right). (*b*) the spatial extent of the lowest unoccupied molecular orbital and (*c*) the spatial extent of the highest occupied molecular orbital.

As is further shown in FIG. 2, type 3 is a configuration where the ambipolar phosphine oxide host material has two or more phosphine oxide groups. In this configuration, the phosphine oxide groups are further bonded to an electron transporting group, thereby forming a bridge between adjacent phosphine oxide groups and each of the phosphine oxide groups, and are further bonded to at least one hole transporting group. In this configuration, the electron transporting group that forms a bridge between adjacent phosphine oxide groups may be reversibly reduced. The ambipolar phosphine oxide host material used in the emission layer of this third example is shown in FIG. 6. In the example shown, a dibenzothiophene unit is substituted with two phosphoryl groups that prevent electronic communication with the two HTGs (triphenylamine units) attached on either side of the ETG bridge. This design ensures that the orbital density of the HOMO is found only on the HTG units and the orbital density of the LUMO is only found on the ETG bridge. The best embodiment would attach the HTG groups through a meta-linkage to prevent the inductive influence of the phosphoryl group from lowering the energy of the HOMO.

Figure 7:
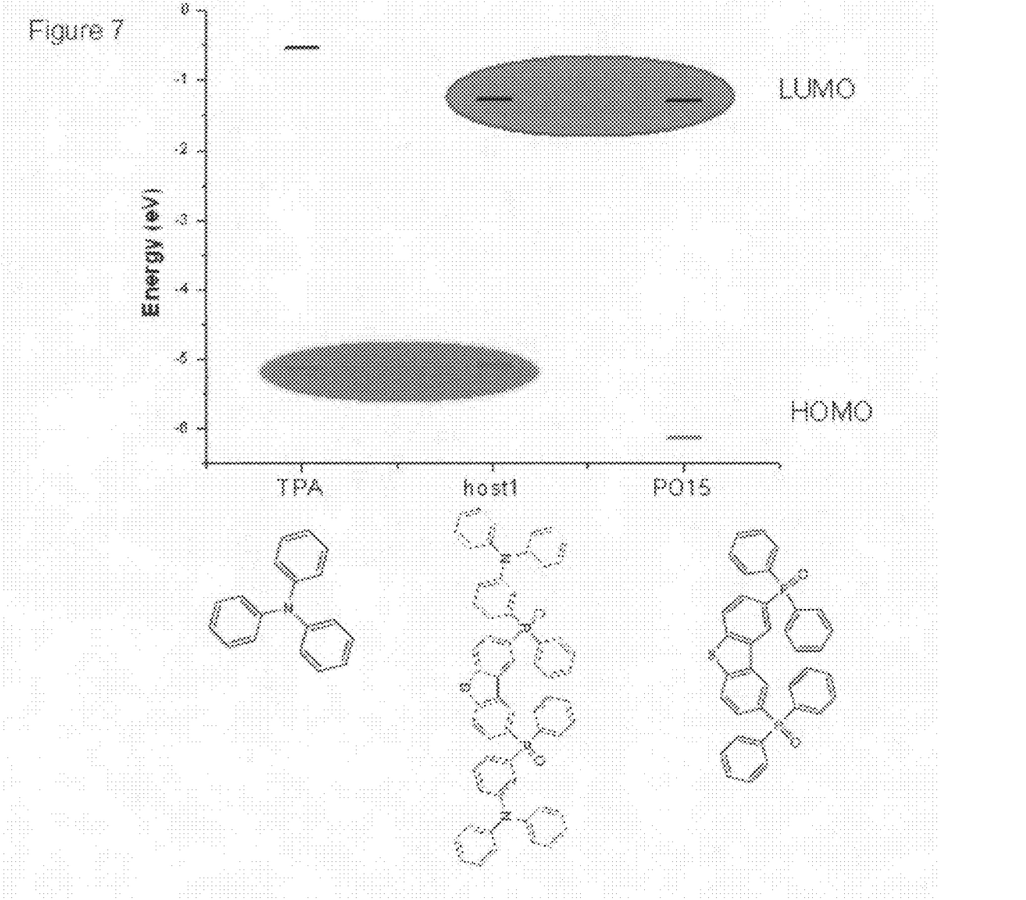
FIG. 7 shows an energy level diagram computed for a three layer device based on embodiment 3 of the invention and incorporating a triphenyl amine hole transport layer, a bis (diphenylphosphoryl)dibenzothiophene electron transporting layer and an ambipolar host layer conforming to the invention. The energy levels are computed using Spartan '04 (Version 1.0.3; Wavefunction, Inc.) at the B3LYP/6-31G*level. The HOMOs of the hole transporting layer and the ambipolar host layer are aligned (red oval) as are the LUMOs of the electron transporting layer and the ambipolar host layer so that there are no significant barriers to electron or hole injection into the ambipolar host layer, which will be doped with a blue phosphorescent molecule.

FIG. 7 shows a computed energy level diagram of the three layer system [computed using Spartan '04 (Version 1.0.3; Wavefunction, Inc.) at the B3LYP/6-31G*level] for the third embodiment of the invention, illustrating how the HOMO of the HTL and HOMO of the ambipolar host have substantially equal energies, as do the LUMO of the ETL and the LUMO of the ambipolar host.

What is common to all three embodiments is that the spatial extent of the HOMO is substantially restricted to the HTG in both the hole transport layer and the ambipolar host material. Similarly, the spatial extent of the LUMO is substantially restricted to the ETG in both the electron transport layer and the ambipolar host. It is this design rule that ensures alignment of the LUMO energy of the ETL with that of the ambipolar host and of the HOMO energy of the HTL with that of the ambipolar host.

In all the above embodiments it will be recognized by those skilled in the art that HOMO and LUMO alignments at both metal/organic and organic/organic heterointerfaces can be influenced by interfacial dipoles at the interface, which cause a shift in the vacuum level and consequentially a shift in the energy level alignment. It is also recognized, however, that such shifts are relatively small and, in these materials systems, likely to be <0.2 eV ("Energy Level Alignment at Interfaces of Organic Semiconductor Heterostructures, I. G. Hill and A. Kahn, Journal of Applied Physics Volume 84, number 10, 15 Nov. 1998). Such shifts are small compared to, for example, the HOMO offset between the hole transporting material a-NPD and POI (1.7 eV) and are therefore neglected in the above argument. It is to be understood that the term "energy level alignment" as used herein means that the HOMOs and/or LUMOs in the thin film device are aligned to within 0.2 eV in the assembled device.

Figure 3:
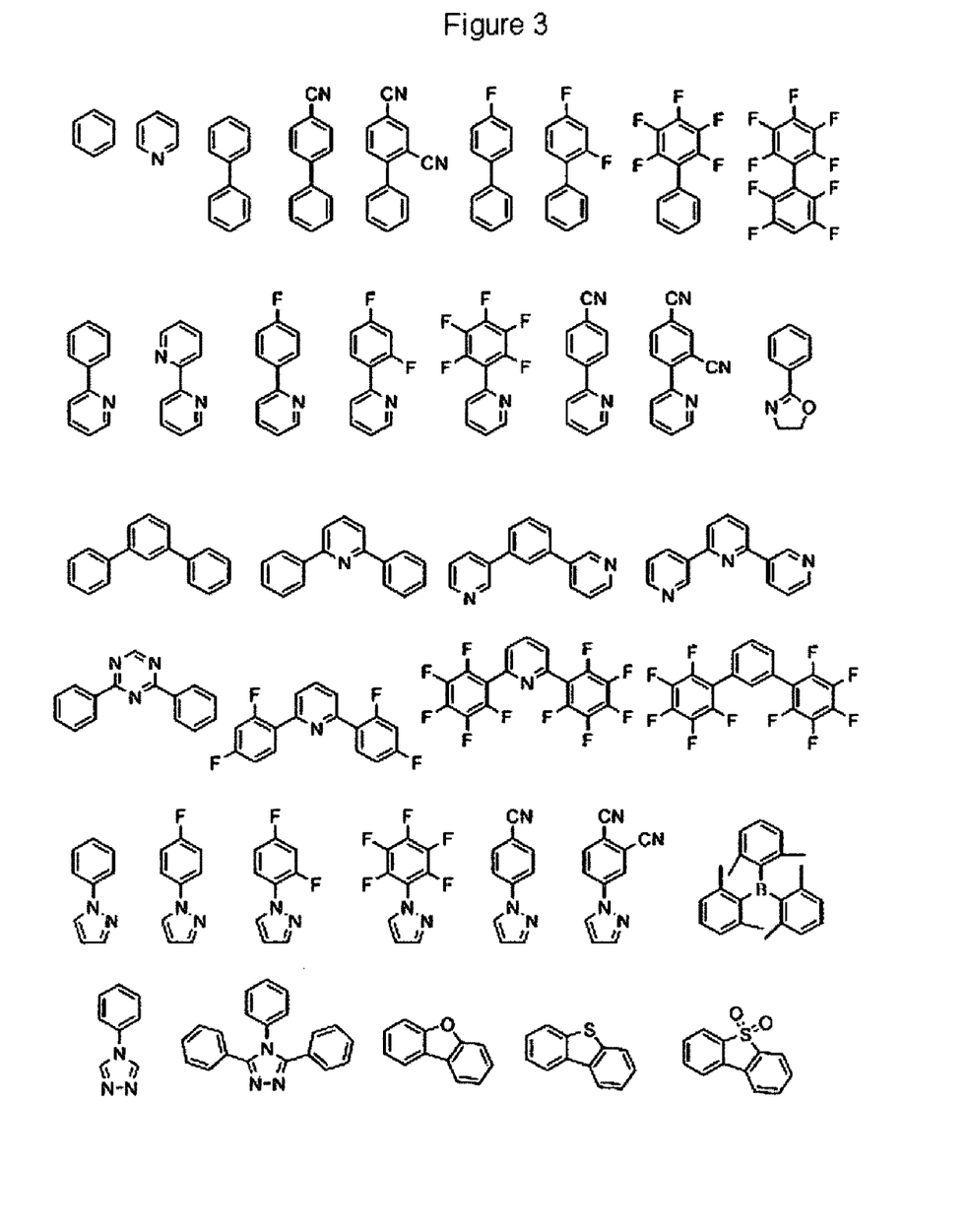
FIG. 3 is a drawing showing the molecular structures of some potential ETG moieties. These molecules are substituted with one or more phosphoryl groups to yield a stable, electron transporting molecule.
Figure 8:
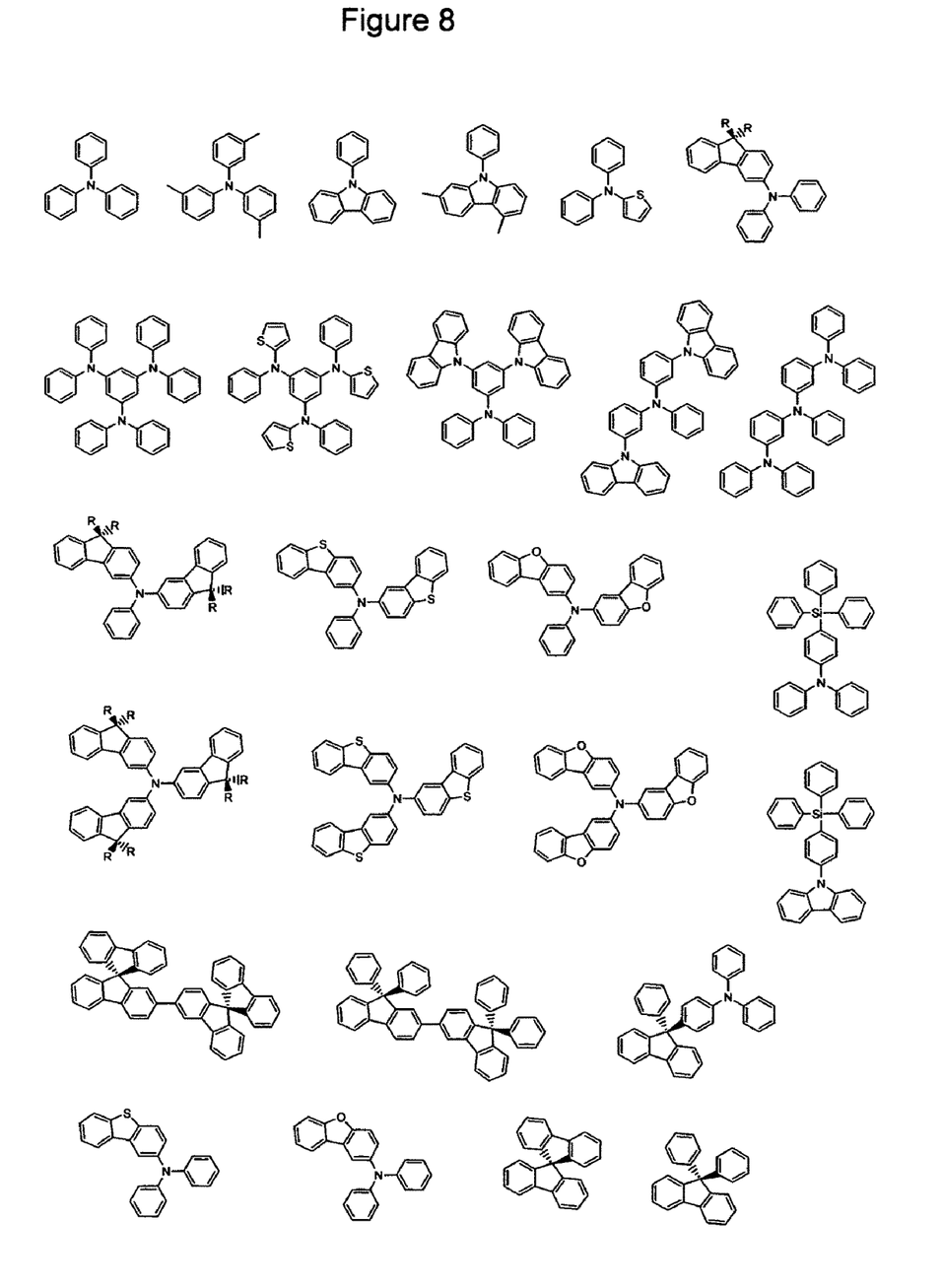
FIG. 8 shows molecular structures of some potential HTG moieties. These molecules may be further substituted to improve stability but the HOMO of the overall molecule will be similar to that of the HTG.

There are many potential choices for the ETG and HTG within a particular system that will satisfy the designs of the above embodiments. For illustration, a selection of potential ETGs is shown in FIG. 3 and a selection of potential HTGs is shown in FIG. 8.

While the invention has been illustrated and described in detail in the drawings and foregoing description, the same is to be considered as illustrative and not restrictive in character. Only certain embodiments have been shown and described, and all changes, equivalents, and modifications that come within the spirit of the invention described herein are desired to be protected. Any experiments, experimental examples, or experimental results provided herein are intended to be illustrative of the present invention and should not be considered limiting or restrictive with regard to the invention scope. Further, any theory, mechanism of operation, proof, or finding stated herein is meant to further enhance understanding of the present invention and is not intended to limit the present invention in any way to such theory, mechanism of operation, proof, or finding.

Thus, the specifics of this description and the attached drawings should not be interpreted to limit the scope of this invention to the specifics thereof. Rather, the scope of this invention should be evaluated with reference to the claims appended hereto. In reading the claims it is intended that when words such as "a", "an", "at least one", and "at least a portion" are used there is no intention to limit the claims to only one item unless specifically stated to the contrary in the claims. Further, when the language "at least a portion" and/or "a portion" is used, the claims may include a portion and/or the entire items unless specifically stated to the contrary. Likewise, where the term "input" or "output" is used in connection with an electric device or fluid processing unit, it should be understood to comprehend singular or plural and one or more signal channels or fluid lines as appropriate in the context. Finally, all publications, patents, and patent applications cited in this specification are herein incorporated by reference to the extent not inconsistent with the present disclosure as if each were specifically and individually indicated to be incorporated by reference and set forth in its entirety herein.

The invention claimed is:

1. An OLED device comprising:
   an emission layer having an ambipolar phosphine oxide host material and a dopant and having a first side and a second side,
   the first side of the emission layer in electrical communication with a hole transport layer, and the hole transport layer in electrical communication with an anode,
   the second side of the emission layer in electrical communication with an electron transport layer, and the electron transport layer in communication with a cathode,
   wherein
   the HOMO energy of the hole transport layer is substantially the same as the HOMO energy of the ambipolar host in the emission layer, and the LUMO energy of the electron transport layer is substantially the same as the LUMO energy of the ambipolar host in the emission layer.

2. The OLED device of claim 1 wherein the ambipolar phosphine oxide host material has a phosphine oxide bonded to at least one electron transporting group, the phosphine oxide further bonded to an active bridge, the active bridge further bonded to a hole transporting group.

3. The OLED device of claim 2 wherein the active bridge is conjugated with the hole transporting group.

4. The OLED device of claim 2 wherein the active bridge may be reversibly oxidized and reversibly reduced.

5. The OLED device of claim 1 wherein the ambipolar phosphine oxide host material has a phosphine oxide bonded to at least one electron transporting group, the phosphine oxide further bonded to an inert bridge, the inert bridge further bonded to a hole transporting group.

6. The OLED device of claim 5 wherein the inert bridge is not conjugated with the the hole transporting group.

7. The OLED device of claim 5 wherein the inert bridge may not be reversibly oxidized and reversibly reduced.

8. The OLED device of claim 1 wherein the ambipolar phosphine oxide host material has two or more phosphine oxide groups, the phosphine oxide groups bonded to an electron transporting group forming a bridge between adjacent phosphine oxide groups, and each of the phosphine oxide groups further bonded to at least one hole transporting group.

9. The OLED device of claim 2 wherein the electron transporting group forming a bridge between adjacent phosphine oxide groups may be reversibly reduced.

10. The OLED device of claim 1 wherein the difference between the HOMO energy of the ambipolar host in the emission layer and the HOMO energy of the hole transport layer is equal to or less than 0.2 eV.

11. The OLED device of claim 1 wherein the difference between the LUMO energy of the emission layer and the LUMO energy of the electron transport layer is equal to or less than 0.2 eV.

12. The OLED device of claim 1 wherein the HOMO energy of the hole transporting group with respect to vacuum is between −4 eV and −7 eV.

13. The OLED device of claim 1 wherein the LUMO energy of the electron transporting group with respect to vacuum is between −1 eV and −4 eV.

* * * * *

UNITED STATES PATENT AND TRADEMARK OFFICE
CERTIFICATE OF CORRECTION

| | | |
|---|---|---|
| PATENT NO. | : 7,893,430 B2 | Page 1 of 1 |
| APPLICATION NO. | : 12/380315 | |
| DATED | : February 22, 2011 | |
| INVENTOR(S) | : Sapochak et al. | |

It is certified that error appears in the above-identified patent and that said Letters Patent is hereby corrected as shown below:

On title page Item (75)
The name of the THIRD INVENTOR should be corrected as follows:

Asanga Bimalchandra Padmaperuma

Signed and Sealed this
Seventh Day of June, 2011

David J. Kappos
*Director of the United States Patent and Trademark Office*